(12) United States Patent
Eziri et al.

(10) Patent No.: US 6,753,300 B2
(45) Date of Patent: Jun. 22, 2004

(54) LUBRICANT SHEET FOR MAKING HOLE AND METHOD OF MAKING HOLE WITH DRILL

(75) Inventors: Mitsuo Eziri, Tokyo (JP); Shinya Komatsu, Tokyo (JP); Masaru Taguchi, Tokyo (JP); Norio Nagai, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 188 days.

(21) Appl. No.: 09/944,125

(22) Filed: Sep. 4, 2001

(65) Prior Publication Data

US 2002/0051684 A1 May 2, 2002

(30) Foreign Application Priority Data

| Sep. 4, 2000 | (JP) | 2000/267225 |
|---|---|---|
| Sep. 4, 2000 | (JP) | 2000/267226 |
| Sep. 4, 2000 | (JP) | 2000/267227 |
| Oct. 11, 2000 | (JP) | 2000/310571 |
| Apr. 5, 2001 | (JP) | 2001/107063 |

(51) Int. Cl.⁷ .............................................. B23B 35/00
(52) U.S. Cl. ........................ 508/100; 508/501; 508/579; 408/1 R; 408/87
(58) Field of Search ........................... 408/1 R; 508/100

(56) References Cited

U.S. PATENT DOCUMENTS

| 4,781,495 A | * | 11/1988 | Hatch et al. ............. | 408/1 R |
| 4,929,370 A | * | 5/1990 | Hatch et al. ............. | 508/100 |
| 5,067,859 A | * | 11/1991 | Korbonski ................ | 408/1 R |
| 5,082,402 A | * | 1/1992 | Gaku et al. .............. | 408/1 R |
| 5,507,603 A | * | 4/1996 | Nakano et al. ........... | 408/1 R |
| 5,716,168 A | * | 2/1998 | Janoff ..................... | 408/1 R |
| 5,785,465 A | * | 7/1998 | Korbonski ................ | 408/1 R |
| 6,000,886 A | * | 12/1999 | Washio et al. ............ | 408/1 R |
| 6,127,038 A | * | 10/2000 | McCullough et al. ...... | 428/416 |
| 6,200,074 B1 | * | 3/2001 | Miller et al. ............. | 408/1 R |

FOREIGN PATENT DOCUMENTS

| EP | 0 470 757 | 2/1992 |
| EP | 0 629 109 | 12/1994 |
| EP | 0 642 297 | 3/1995 |

OTHER PUBLICATIONS

Patent Abstracts of Japan, vol. 1999, No. 03, Mar. 31, 1999, Abstract of JP 10 335780 A.

* cited by examiner

Primary Examiner—Ellen M McAvoy
(74) Attorney, Agent, or Firm—Wenderoth, Lind&Ponack, LLP

(57) ABSTRACT

A lubricant sheet for making a hole used for a printed circuit board, comprising an organic substance layer having a thickness of 0.02 to 3.0 mm and formed of a mixture (a) or a mixture (b) and a metal foil having a thickness of 0.05 to 0.5 mm, said organic substance layer being formed on one surface of said metal foil, said mixture (a) being a mixture containing polyether ester (I), a solid water-soluble lubricant (II) and polyethylene glycol (III) having a number average molecular weight of 200 to 600, and said mixture (b) being a mixture containing said polyether ester (I), said solid water-soluble lubricant (II) and a liquid water-soluble lubricant (IV), and a method of making a hole which uses the lubricant sheet.

14 Claims, No Drawings

LUBRICANT SHEET FOR MAKING HOLE AND METHOD OF MAKING HOLE WITH DRILL

FIELD OF THE INVENTION

The present invention relates to a metal foil composite sheet for making a hole for use in printed circuit board fields and a method of making a hole which method uses the above sheet and is capable of making a hole in high quality. More specifically, it relates to a lubricant sheet for making a hole which lubricant sheet serves to improve quality and productivity with regard to drilling works in printed circuit board fields and, when a hole having a diameter of 2 mm or less is made, which lubricant sheet prevents heat generation of a drill bit by a frictional heat, improves location accuracy and is capable of making a hole in high quality and at high efficiency, and a method of making a hole in a printed circuit board which method uses the above lubricant sheet.

RELATED ARTS OF THE INVENTION

U.S. Pat. Nos. 4,781,495 and 4,929,370 disclose methods of making a hole in a printed circuit board with a drill in which, when a hole for conduction between front and reverse surfaces is made in a printed circuit board with a drill, one surface or both surfaces of the printed circuit board is/are provided with a sheet obtained by impregnating paper or the like with a water-soluble lubricant, specifically which is a mixture of a synthetic wax which is a solid water-soluble lubricant and is formed of glycols such as diethylene glycol or dipropylene glycol and a fatty acid with a nonionic surfactant. However, these methods have defects. The defects are that the effect of preventing a heat generation of a drill is insufficient, that the impregnation of a porous sheet with the above mixture is poor and that the sheet is sticky.

As means for solving the above defects, JP-A-4-92494 publication and JP-A-6-344297 publication propose hole-making methods using a lubricant mixture sheet composed of polyethylene glycol or polyether ester and a water-soluble lubricant.

The above methods improve the quality of a drilled hole and provide an improvement in the stickiness. However, when the thickness of a layer of a lubricant is thick, a metal foil composite sheet composed of the lubricant and a metal foil warps largely in some cases, so that the above methods have a problem with workability. When a sheet is integrated with a metal foil, for maintaining bonding properties it is required to bond the sheet to the metal foil at a temperature where the sheet is sufficiently softened. As a result, the warpage of the resultant composite sheet tends to increase by the influence of a thermal shrinkage, which causes a problem with productivity or workability. Further, there is found a tendency that location accuracy of a hole decreases with decreasing the diameter of a drill bit to be used. Therefore, improvements are required for applying the above methods when a drill having an extreme small diameter is used.

SUMMARY OF THE INVENTION

It is an object of the present invention to provide a lubricant sheet for making a hole for a printed circuit board which lubricant sheet is excellent in the effect of preventing heat generation of a drill bit and which lubricant sheet is free from stickiness and a method of making a hole which uses the above sheet.

It is another object of the present invention to provide a lubricant sheet for making a hole for a printed circuit board which lubricant sheet is almost free from the occurrence of warpage, gives a hole excellent in quality and can improve workability and a method of making a hole which method uses the above sheet.

It is further another object of the present invention to provide a lubricant sheet for making a hole which gives a hole having excellent form and which can maintain a fine location accuracy of a hole even when a hole is made with a drill bit having a diameter of 0.3 mm or less and a method of making a hole which uses the above sheet.

According to the present invention 1, there are provided a lubricant sheet for making a hole used for a printed circuit board, comprising an organic substance layer having a thickness of 0.02 to 3.0 mm and formed of a mixture (a) or a mixture (b) and a metal foil having a thickness of 0.05 to 0.5 mm, said organic substance layer being formed on one surface of said metal foil, said mixture (a) being a mixture containing 20 to 90 parts by weight of polyether ester (I), 10 to 80 parts by weight of a solid water-soluble lubricant (II), the total amount of the polyether ester (I) and the solid water-soluble lubricant (II) being 100 parts by weight, and 2 to 10 parts by weight of polyethylene glycol (III) having a number average molecular weight of 200 to 600, and said mixture (b) being a mixture containing 20 to 90 parts by weight of said polyether ester (I), 10 to 80 parts by weight of said solid water-soluble lubricant (II), the total amount of the polyether ester (I) and the solid water-soluble lubricant (II) being 100 parts by weight, and 2 to 20 parts by weight of a liquid water-soluble lubricant (IV), and a method of making a hole which uses the above lubricant sheet.

According to the present invention 2, further, there are provided a lubricant sheet for making a hole used for a printed circuit board, comprising a layer formed of a water-soluble polymer and having a thickness of 0.02 to 3.0 mm and a metal foil having a thickness of 0.05 to 0.5 mm, said water-soluble polymer layer being formed on one surface of said metal foil, and the lubricant sheet having at least one characteristic selected from (a), (b) and (c),
(a) said water-soluble polymer layer is formed of a mixture of the water-soluble polymer and an organic filler (V),
(b) the surface of said metal foil which surface is to be bonded to said water-soluble polymer layer has a surface roughness of from 5 to 15 μm, and
(c) said metal foil is an aluminum foil having an aluminum purity of at least 99.5%, and a method of making a hole which uses the above lubricant sheet.

In the present invention 2, there is preferably used as a water-soluble polymer layer an organic substance layer composed of from 20 to 90 parts by weight of polyether ester (I) and from 10 to 80 parts by weight of a solid water-soluble lubricant (II).

DETAILED DESCRIPTION OF THE INVENTION

The present inventors have made various studies and as a result found the following as the present invention 1. When a lubricant mixture layer obtained by incorporating a polyethylene glycol (III) having a number average molecular weight of from 200 to 600 into polyether ester (I) and a solid water-soluble lubricant (II) or a lubricant mixture layer obtained by incorporating a liquid water-soluble lubricant (IV) into polyether ester (I) and a solid water-soluble lubricant (II) is formed on a metal foil to form a lubricant sheet for making a hole, the lubricant sheet shows little warpage. On the basis of the above finding, the present inventors have completed the present invention 1.

The present inventors have found as the present invention 2 the following. Concerning a lubricant sheet obtained by forming a layer formed of a water-soluble polymer and having a thickness of from 0.02 to 3.0 mm on one surface of a metal foil having a thickness of from 0.05 to 0.5 mm for making a hole for a printed circuit board, a lubricant sheet having at least one characteristic selected from the following (a), (b) and (c) is almost free from warpage, gives a hole having excellent form and gives excellent location accuracy of a hole,
  (a) the water-soluble polymer layer is formed of a mixture of the water-soluble polymer and an organic filler (V),
  (b) the surface of the metal foil which surface is to be bonded to the water-soluble polymer layer has a surface roughness of from 5 to 15 $\mu$m, and
  (c) the metal foil is an aluminum foil having an aluminum purity of at least 99.5%.
On the basis of the above finding, the present inventors have completed the present invention 2.

The present inventors have further found that an organic substance layer composed of from 20 to 90 parts by weight of the polyether ester (I) and from 10 to 80 parts by weight of the solid water-soluble lubricant (II) is preferably used as the water-soluble polymer layer in view of exhibiting the above function and effect of the present invention.

The polyether ester (I) used in the present invention is not specially limited so long as it is an esterification product of a linear compound having an ether bond in a main chain. Typical examples of the polyether ester (I) includes resins obtained by reacting a glycol polymer or ethylene oxide polymer such as polyethylene glycol, polyethylene oxide, polypropylene glycol, polytetramethylene glycol, polypropylene oxide and copolymers of these, with a polyvalent carboxylic acid, its anhydride or its ester such as phthalic acid, isophthalic acid, terephthalic acid, sebacic acid, dimethylesters and diethylesters of these, and pyromellitic acid anhydride. These resins maybe used alone or in combination as required. Further, it is also possible to mix a polyethylene oxide having a number average molecular weight of at least 10,000 with the polyether ester (I). The content of the polyethylene oxide in 100 parts by weight of the polyether ester (I) is from 1 to 500 parts by weight, preferably from 10 to 200 parts by weight.

The polyether ester (I) preferably has a melting point or a softening point of form 30 to 200° C., more preferably from 35 to 150° C., further more preferably from 40 to 150° C. The amount of the polyether ester (I) is from 20 to 90 parts by weight, when the total amount of the polyether ester (I) and the solid water-soluble lubricant (II) is 100 parts by weight. When the amount of the polyether ester (I) is smaller than the above lower limit, the lubricant sheet is poor in strength. When it is larger than the above upper limit, the lubricant sheet is insufficient in wettability. Therefore, such sheets do not suit the object of the present invention.

The solid water-soluble lubricant (II) used in the present invention specifically includes a polyethylene glycol having a number average molecular weight of from 1,000 to 9,000; monoethers of polyoxyethylene such as polyoxyethylene oleyl ether, polyoxyethylene cetyl ether, polyoxyethylene stearyle ether, polyoxyethylene lauryl ether, polyoxyethylene nonyl phenyl ether or polyoxyethylene octyl phenyl ether; polyoxyehtylene monostearate, polyoxyethylene sorbitan monostearate; polyglycerine monostearates such as hexaglycerine monostearate or decahexaglycerine monostearate; and polyoxyethylene propylene block polymer. These lubricants may be used alone or in combination as required.

The melting point or the softening point of the solid water-soluble lubricant (II) is preferably from 30 to 200° C., more preferably from 35 to 150° C.

The amount of the solid water-soluble lubricant (II) is from 10 to 80 parts by weight, when the total amount of the polyether ester (I) and the solid water-soluble lubricant (II) is 100 parts by weight. When the amount of the solid water-soluble lubricant (II) is smaller than the above lower limit, undesirably, the viscosity of the lubricant sheet becomes too high. When it is lager than the above upper limit, undesirably, the lubricant sheet becomes fragile.

The polyethylene glycol (III) having a number average molecular weight of from 200 to 600, used in the present invention 1, is obtained by polymerization of ethylene oxide and it refers to a compound which is liquid at room temperature. The polyethylene glycol (III) having a number average molecular weight of from 200 to 600 is added in an amount of 2 to 10 parts by weight, preferably 3 to 8 parts by weight, when the total amount of the polyether ester (I) and the solid water-soluble lubricant (II) is 100 parts by weight. When the amount of the polyethylene glycol (III) having a number average molecular weight of from 200 to 600 is lower than the above lower limit, the effect of improving the lubricant sheet in warpage is poor. When it is larger than the above upper limit, the lubricant sheet tends to become sticky. Such lubricant sheets do not suit the object of the present invention.

The liquid water-soluble lubricant (IV) used in the present invention 1 refers to a water-soluble lubricant which is liquid at room temperature. Typical examples of the water-soluble lubricant (IV) includes polyoxyethylene oleyl ether, polyoxyethylene dodecyl ether, polyoxyethylene nonyl phenyl ether, polyoxyethylene octyl phenyl ether; esters of polyoxyethylene such as polyoxyehtylene monolaurate, polyoxyehtylene monostearate or polyoxyethylene monooleate; sorbitan monoesters of polyoxyethylene such as polyoxyethylene sorbitan monolaurate or polyoxyethylene sorbitan monooleate; polyglycerine monoesters such as hexaglycerine monolaurate or decaglycerine monooleate; and polyoxyethylene propylene block polymer. These lubricants may be used alone or in combination as required.

The liquid water-soluble lubricant (IV) is added in an amount of from 2 to 20 parts by weight, preferably from 5 to 15 parts by weight, when the total amount of the polyether ester (I) and the solid water-soluble lubricant (II) is 100 parts by weight. When the amount of the liquid water-soluble lubricant (IV) is lower than the above lower limit, the effect of improving the lubricant sheet in warpage is poor. When it is larger than the above upper limit, the lubricant sheet tends to become sticky. Such lubricant sheets do not suit the object of the present invention.

The metal foil used in the present invention 1 is not specially limited so long as it is a known metal foil which is relatively soft and used industrially. Concretely, the metal foil includes a soft aluminum, a semihard aluminum and a hard aluminum. The thickness of the metal foil is in the range of from 50 to 500 $\mu$m. When the thickness of the metal foil is less than 50 μm, undesirably, burrs are apt to occur in a substrate. When it exceeds 500 μm, undesirably, it is difficult to discharge chips generated. The surface of the metal foil, precisely the surface to which the lubricant mixture of the polyether ester (I), the water-soluble lubricant (II) and the polyethylene glycol (III) having a number average molecular weight of from 200 to 600 is to be bonded, is preferably roughened as required for increasing the adhesion of the metal foil surface to the mixture layer.

The organic filler (V) used in the present invention 2 is not specially limited so long as it is selected from generally used organic fillers. Typical Examples of the organic filler (V) include powders or fine particles of a thermosetting resin and a thermoplastic resin such as a phenol resin, a melamine resin, a benzoguanamine resin, an epoxy resin, a silicone resin, an acrylic resin, a methacrylate resin, a polyurethane resin, a polycarbonate resin, a polyphenylene ether resin or a polyester resin, and powders of a natural product such as a cellulose powder or a wood powder. The average particle diameter of the organic filler (V) is 50 μm or less, preferably approximately from 1 to 10 μm. The organic filler (V) is added in an amount of from 1 to 50 parts by weight, preferably from 5 to 30 parts by weight, when the total amount of the polyether ester (I) and the solid water-soluble lubricant (II) is 100 parts by weight. When the amount of the organic filler (V) is smaller than the above lower limit, the effect of improving the lubricant sheet in warpage is poor. When it is larger than the above upper limit, the viscosity of the lubricant mixture increases so that it becomes difficult to knead it.

The metal foil used in the present invention 2 is not specially limited, so long as it is a relatively soft and industrially used metal foil of which one surface, to be bonded to a water-soluble polymer layer, more concretely an organic substance layer formed of a mixture of the polyether ester (I) and the solid water-soluble lubricant (II), has a surface roughness of from 5 to 15 μm (maximum height defined according to JIS B-0601: Ry). When the surface roughness is in the above range, the adhesion strength between the metal foil and the water-soluble polymer layer increases and the warpage decreases.

Concrete examples of the metal foil include a soft aluminum, a semihard aluminum and a hard aluminum. The thickness of the metal foil is in the range of from 50 to 500 μm. When the thickness of the metal foil is less than 50 μm, undesirably, burrs are apt to occur in a substrate. When it exceeds 500 μm, undesirably, it is difficult to discharge chips generated.

The metal foil used in the present invention 2 is not specially limited so long as it is an aluminum foil having an aluminum purity of at least 99.5%. More preferred is an aluminum foil having a purity of at least 99.7%. The use of a high-purity aluminum foil alleviates the impact of a drill bit and improves bite properties of a drill bit. These effects are in synergy with the effect of decreasing heat generation of a drill bit by a frictional heat owing to the water-soluble polymer, which can make considerable improvements in location accuracy and the quality of a hole when a hole is made with a drill. Concrete examples of the kind of aluminum foil include 1050, 1070 and 1085 which are defined according to JIS H-4160. Particularly preferred are 1070 and 1085. The thickness of aluminum foil is in the range of from 50 to 500 μm. When the thickness of aluminum foil is less than 50 μm, undesirably, burrs are apt to occur in a substrate. When it exceeds 500 μm, undesirably, it is difficult to discharge chips generated.

The method of producing a lubricant sheet for making a hole is not specially limited so long as it is selected from known industrial methods. Concrete examples of the method are as follows. A lubricant mixture of the polyether ester (I) with the water-soluble lubricant (II) and etc. is kneaded by a method using a roll or a kneader or other kneading methods to obtain a uniform lubricant mixture. The above kneading may be carried out under heat as required. Then, the lubricant sheet of the present invention is produced by a method in which the above-obtained uniform lubricant mixture is applied to a metal foil by a roll method, a curtain method or the like preferably in the state where the lubricant mixture has a viscosity of 50,000 to 200,000 centipoise (150° C.) to form a coating layer on the metal foil, or a method in which the above uniform lubricant mixture is molded with a press, a roll or a T-die extruder to form a sheet having a desired thickness in advance, the sheet is placed on a metal foil and the sheet is brought into intimate contact with the metal foil with an adhesive or by heating or pressurization with a press or a roll. The thickness of the lubricant mixture layer of the lubricant sheet for making a hole is from 0.02 to 3.0 mm, more preferably from 0.02 to 2.0 mm. When the thickness of the lubricant mixture layer is less than the above lower limit, undesirably, the quality of a hole to be made decreases. When it is more than the above upper limit, undesirably, chips of the lubricant sheet wrap a drill bit at the time of making a hole.

In the method of making a hole, provided by the present invention, the above lubricant sheet for making a hole is disposed on at least a topmost surface of a printed circuit board such as a copper clad laminate or a multi-layered board such that the metal foil layer of the lubricant sheet for making a hole is in contact with the printed circuit board and a hole is made with a drill from the topmost surface side.

Effect of the Invention

According to the present invention, there are provided a lubricant sheet for making a hole which lubricant sheet is almost free from warpage and a method of making a hole which uses the above lubricant sheet. Since the lubricant sheet is almost free from warpage, it becomes easy to dispose the lubricant sheet of the present invention on a printed circuit board. Further, the effect of decreasing a frictional heat at the time of making a hole owing to the lubricant is excellent so that a hole can be made in high quality and at high efficiency. Therefore, the present invention has remarkably high industrially practical utility.

According to the present invention, there are provided a lubricant sheet for making a hole which lubricant sheet is improved in the adhesion between a metal foil and a sheet by adjusting in the specific range the surface roughness of a metal foil surface to be bonded to a water-soluble polymer layer and a method of making a hole which uses the above lubricant sheet. The improvement in the adhesion consequently decreases the warpage of the above lubricant sheet so that it becomes easy to dispose the lubricant sheet on a printed circuit board. Further, the effect of decreasing a frictional heat at the time of making a hole owing to the water-soluble polymer is excellent so that a hole can be made in high quality and at high efficiency. Therefore, the present invention has remarkably high industrially practical utility.

According to the present invention, there are provided a lubricant sheet for making a hole which uses a high-purity aluminum foil as a metal foil and which is consequently improved in the effects of alleviating an impact and improving bite properties of a drill bit at the time of making a hole owing to the high-purity aluminum foil in addition to an improvement in the effect of decreasing a frictional heat of a drill bit at the time of making a hole owing to a water-soluble polymer, and a method of making a hole which uses the above lubricant sheet. It becomes possible to make a high quality hole which is excellent in the form of a hole and location accuracy of a hole. Therefore, the present invention has remarkably high industrially practical utility.

EXAMPLE 1

50 parts by weight of a polyethylene glycol.dimethyl terephthalate polycondensate (trade name: PAOGEN PP-15, supplied by Dai-ichi Kogyo seiyaku Co., Ltd.), 50 parts by weight of polyoxyethylene monostearate (trade name: Nonion S-40, supplied by NOF Corporation) and 8 parts by weight of polyethylene glycol having a number average molecular weight of 600 were kneaded with a kneader in a nitrogen atmosphere at a temperature of 150° C., and the kneaded mixture was extruded with an extruder to form a sheet having a thickness of 0.2 mm. The sheet was placed on one surface of a hard aluminum foil having a thickness of 100 $\mu$m and brought into intimate contact with the hard aluminum foil with a heat roll to form a lubricant sheet for making a hole. The lubricant sheet for making a hole had no stickiness and the lubricant sheet was easy to handle.

The above lubricant sheet for making a hole was cut to a size of 340 mm×510 mm. The resultant lubricant sheet having a size of 340 mm×510 mm was allowed to stand in an atmosphere having a temperature of 20° C. and a humidity of 40% for 24 hours and then measured for warpage. Table 1 shows the results thereof.

Further, two glass epoxy six-layered boards (internal layer: four layers, thickness of a copper foil as an internal layer: 70 $\mu$m, thickness of a copper foil as an external layer: 18 $\mu$m) having a thickness of 1.6 mm each were stacked. The lubricant sheet for making a hole was disposed on the top surface of the stacked boards such that the aluminum foil side of the lubricant sheet faced downward. A backup board (paper phenol laminate) was disposed on the lower surface of the stacked boards. Then, holes were made with a drill under conditions of a drill bit: 0.35 mm $\phi$, the number of revolutions: 80,000 rpm, and a feeding rate: 1.6 m/min. The holes were evaluated for haloing, smear and location accuracy. Table 1 shows the results.

EXAMPLE 2

70 parts by weight of a polyethylene glycol.dimethyl terephthalate polycondensate (trade name: PAOGEN PP-15), 30 parts by weight of polyethylene glycol having a number average molecular weight 8,000, 6 parts by weight of polyethylene glycol having a number average molecular weight of 400 were used. The same procedures as those in Example 1 were carried out to obtain a lubricant sheet for making a hole. The lubricant sheet was measured for warpage and evaluated for holes in the same manner as in Example 1. Table 1 shows the results.

EXAMPLE 3

20 parts by weight of a polyethylene glycol.dimethyl terephthalate polycondensate (trade name: PAOGEN PP-15), 10 parts by weight of polyethylene oxide having a number average molecular weight of 40,000 (trade name: ALKOX R-150, supplied by MEISEI CHEMICAL WORKS, LTD), 70 parts by weight of polyoxyethylene propylene block polymer (trade name: Pronon 208, supplied by NOF Corporation) and 5 parts by weight of polyethylene glycol having a number average molecular weight of 200 were used. The same procedures as those in Example 1 was carried out, to obtain a lubricant sheet for making a hole. The lubricant sheet was measured for warpage and evaluated for holes in the same manner as in Example 1. Table 1 shows the results.

Comparative Example 1

A lubricant sheet for making a hole was obtained in the same manner as in Example 1 except that the polyethylene glycol having a number average molecular weight of 600 used in Example 1 was not used. The lubricant sheet was measured for warpage and evaluated for holes in the same manner as in Example 1. Table 1 shows the results.

Comparative Example 2

Holes were made under the same conditions for making a hole with a drill as those in Example 1 except that the lubricant sheet for making a hole obtained in Example 1 was replaced with a hard aluminum foil having a thickness of 150 $\mu$m. The holes were evaluated. Table 1 shows the results.

TABLE 1

| | Warpage of lubricant sheet | Evaluation Results of hole (after 4,000 hits) | | |
|---|---|---|---|---|
| | | Haloing | Smear | Location accuracy of hole |
| Example 1 | 16 mm | 140 $\mu$m | 9.5 (9.0) | 30 $\mu$m |
| Example 2 | 21 | 120 | 9.6 (9.1) | 30 |
| Example 3 | 18 | 130 | 9.4 (8.9) | 40 |
| Comparative Example 1 | 40 | 150 | 9.4 (8.9) | 40 |
| Comparative Example 2 | 0 | 500 | 8.5 (4.0) | 70 |

Explanations of the Above Values of Properties

Haloing: When a hole is made in a multi-layered board, an impact at the time of making a hole causes a delamination at an interface between an copper oxide surface of an internal layer and a resin in a through hole portion. The above copper oxide reacts with hydrochloric acid or sulfuric acid to form a metal salt and the metal salt is dissolved. A portion where the metal salt is dissolved looks white. This phenomenon is called haloing.

Smear: When the diffusion of a frictional heat is insufficient at the time of making a hole in a multi-layered board, the temperature of a drill bit increases so that resin portions of chips are softened and dissolved to re-adhere to a cross section of an internal layer copper foil of a through hole inner wall. This phenomenon is called smear.

(Test Methods)

Warpage: A lubricant sheet is placed on a surface plate and the four corners of the sheet were measured for warpage with a loupe. The maximum value was shown for expressing warpage.

Haloing: A multi-layered board was immersed in 4N.HCL at 25° C. for 5 minutes and then observed with a microscope. The maximum value of haloing was shown.

Smear: The cross sections of 20 through holes were observed with a microscope. 10 points were given when no smear was found, and 0 point was given when smear was found over all. An average value of the 20 through holes was calculated for expressing smear. ( ) shows a lowest point.

Location accuracy of hole: Two sample boards were stacked. Misregistration between a reference value of a hole location and the location of a hole in the lower board of the stacked sample boards after the hole was made was measured with a coordinate measuring machine.

EXAMPLE 4

50 parts by weight of a polyethylene glycol.dimethyl terephthalate polycondensate (trade name: PAOGEN PP-15), 50 parts by weight of solid polyoxyethylene monostearate (trade name: Nonion S-40) and 15 parts by weight of decaglycerine monolaurate (trade name: SY Glyster ML750, supplied by SAKAMOT YAKUHIN KOGYO, Co., LTD) were kneaded with a kneader in a nitrogen atmosphere at a temperature of 150° C., and the kneaded mixture was extruded with an extruder to form a sheet having a thickness of 0.2 mm.

The sheet was placed on one surface of a hard aluminum foil having a thickness of 100 μm and brought into intimate contact with the hard aluminum foil with a heat roll to form a lubricant sheet for making a hole. The lubricant sheet for making a hole had no stickiness and the lubricant sheet was easy to handle.

Thereafter, the above lubricant sheet for making a hole was measured for warpage in the same manner as in Example 1. Table 2 shows the results thereof.

Further, two glass epoxy six-layered boards (internal layer: four layers, thickness of a copper foil as an internal layer: 70 μm, thickness of a copper foil as an external layer: 18 μm) having a thickness of 1.6 mm each were stacked. The lubricant sheet for making a hole was disposed on the top surface of the stacked boards. A backup board (paper phenol laminate) was disposed on the lower surface of the stacked boards. Then, holes were made with a drill under conditions of a drill bit: 0.35 mm φ, the number of revolutions: 80,000 rpm, and a feeding rate: 1.6 m/min. The holes were evaluated. Table 2 shows the results.

EXAMPLE 5

70 parts by weight of a polyethylene glycol.dimethyl terephthalate polycondensate (trade name: PAOGEN PP-15), 30 parts by weight of polyethylene glycol having a number average molecular weight 8,000, 5 parts by weight of polyoxyethylene sorbitan monolaurate (trade name: Nonion LT-221, supplied by NOF Corporation) were used. The same procedures as those of Example 4 were carried out to obtain a lubricant sheet for making a hole. The lubricant sheet was measured for warpage and evaluated for holes in the same manner as in Example 4. Table 2 shows the results.

EXAMPLE 6

20 parts by weight of a polyethylene glycol.dimethyl terephthalate polycondensate (trade name: PAOGEN PP-15), 10 parts by weight of polyethylene oxide having a number average molecular weight of 40,000 (trade name: ALKOX R-150), 70 parts by weight of solid polyoxyethylene propylene block polymer (trade name: Pronon 208) and 10 parts by weight of decaglycerine monolaurate (trade name: SY Glyster ML500, supplied by SAKAMOT YAKUHIN KOGYO, Co., LTD) were used. The same procedures as those in Example 4 was carried out, to obtain a lubricant sheet for making a hole. The lubricant sheet was measured for warpage and evaluated for holes in the same manner as in Example 4. Table 2 shows the results.

TABLE 2

|  | Warpage of lubricant sheet | Evaluation Results of hole (after 4,000 hits) | | |
| --- | --- | --- | --- | --- |
|  |  | Haloing | Smear | Location accuracy of hole |
| Example 4 | 15 mm | 130 μm | 9.5 (9.1) | 40 μm |
| Example 5 | 22 | 150 | 9.6 (9.1) | 40 |
| Example 6 | 19 | 140 | 9.5 (8.9) | 30 |

EXAMPLE 7

40 parts by weight of a polyethylene glycol.dimethyl terephthalate polycondensate (trade name: PAOGEN PP-15), 60 parts by weight of polyoxyethylene monostearate (trade name: Nonion S-40) and 10 parts by weight of fine particles of benzoguanamine-melamine-formaldehyde condensate (trade name: Epostar M30, average particle diameter: 3 μm, supplied by Nippon Shokubai Co., Ltd) were kneaded with a kneader in a nitrogen atmosphere at a temperature of 150° C., and the kneaded mixture was extruded with an extruder to form a sheet having a thickness of 0.2 mm.

The sheet was placed on one surface of a hard aluminum foil having a thickness of 100 μm and brought into intimate contact with the hard aluminum foil with a heat roll to form a lubricant sheet for making a hole. The lubricant sheet for making a hole had no stickiness and the lubricant sheet was easy to handle.

Thereafter, the above lubricant sheet for making a hole was measured for warpage in the same manner as in Example 1. Table 3 shows the results thereof.

Further, two glass epoxy six-layered boards (internal layer: four layers, thickness of a copper foil as an internal layer: 70 μm, thickness of a copper foil as an external layer: 18 μm) having a thickness of 1.6 mm each were stacked. The lubricant sheet for making a hole was disposed on the top surface of the stacked boards. A backup board (paper phenol laminate) was disposed on the lower surface of the stacked boards. Then, holes were made with a drill under conditions of a drill bit: 0.35 mm φ, the number of revolutions: 80,000 rpm, and a feeding rate: 1.6 m/min. The holes were evaluated. Table 3 shows the results.

EXAMPLE 8

70 parts by weight of a polyethylene glycol.dimethyl terephthalate polycondensate (trade name: PAOGEN PP-15), 30 parts by weight of polyethylene glycol having a number average molecular weight 4,000, 20 parts by weight of fine particles of polymethyl methacrylate ester crosslinked substance (trade name: Epostar MA1006, average particle diameter: 6 μm, supplied by Nippon Shokubai Co., Ltd) were used. The same procedures as those in Example 1 were carried out to obtain a lubricant sheet for making a hole. The lubricant sheet was measured for warpage and evaluated for holes in the same manner as in Example 7. Table 3 shows the results.

EXAMPLE 9

20 parts by weight of a polyethylene glycol.dimethyl terephthalate polycondensate (trade name: PAOGEN PP-15), 20 parts by weight of polyethylene oxide having a number average molecular weight of 40,000 (trade name: ALKOX R-150), 60 parts by weight of polyoxyethylene propylene block polymer (trade name: Pronon 208) and 5 parts by weight of fine particles of an acrylic compound (trade name: Epostar YS50, average particle diameter: 5 μm, supplied by Nippon Shokubai Co., Ltd) were used. The same procedures as those in Example 7 was carried out, to obtain a lubricant sheet for making a hole. The lubricant sheet was measured for warpage and evaluated for holes in the same manner as in Example 7. Table 3 shows the results.

Comparative Example 3

A lubricant sheet for making a hole was obtained in the same manner as in Example 7 except that the fine particles of benzoguanamine-melamine-formaldehyde condensate used in Example 7 were not used. The lubricant sheet was measured for warpage and evaluated for holes in the same manner as in Example 7. Table 3 shows the results.

TABLE 3

|  | Warpage of lubricant sheet | Evaluation Results of hole (after 4,000 hits) | | |
|---|---|---|---|---|
|  |  | Haloing | Smear | Location accuracy of hole |
| Example 7 | 20 mm | 140 μm | 9.5 (9.1) | 30 μm |
| Example 8 | 18 | 120 | 9.6 (9.2) | 40 |
| Example 9 | 24 | 150 | 9.5 (9.0) | 30 |
| Comparative Example 3 | 40 | 160 | 9.4 (8.9) | 40 |

EXAMPLE 10

50 parts by weight of a polyethylene glycol.dimethyl terephthalate polycondensate (trade name: PAOGEN PP-15) and 50 parts by weight of polyoxyethylene monostearate (trade name: Nonion S-40) were kneaded with a kneader in a nitrogen atmosphere at a temperature of 150° C., and the kneaded mixture was extruded with an extruder to form a sheet having a thickness of 0.2 mm.

The sheet was placed on one surface of a hard aluminum foil having a thickness of 100 μm and a surface roughness of 10 μm and bonded to the hard aluminum foil with a heat roll at a temperature of 90° C. to obtain a lubricant sheet for making a hole. The lubricant sheet had no stickiness and the lubricant sheet was easy to handle.

The above lubricant sheet for making a hole was cut to a size of 340 mm×510 mm. The resultant lubricant sheet having a size of 340 mm×510 mm was allowed to stand in an atmosphere having a temperature of 20° C. and a humidity of 40% for 24 hours and then measured for sheet adhesion strength and warpage. Table 4 shows the results thereof.

Further, two glass epoxy six-layered boards (internal layer: four layers, thickness of a copper foil as an internal layer: 70 μm, thickness of a copper foil as an external layer: 18 μm) having a thickness of 1.6 mm each were stacked. The lubricant sheet for making a hole was disposed on the top surface of the stacked boards. A backup board (paper phenol laminate) was disposed on the lower surface of the stacked boards. Then, holes were made with a drill under conditions of a drill bit: 0.35 mm φ, the number of revolutions: 80,000 rpm, and a feeding rate: 1.6 m/min. The holes were evaluated. Table 4 shows the results.

EXAMPLE 11

70 parts by weight of a polyethylene glycol.dimethyl terephthalate polycondensate (trade name: PAOGEN PP-15) and 30 parts by weight of polyethylene glycol having a number average molecular weight 8,000 were used. The same procedures as those in Example 10 were carried out to obtain a sheet having a thickness of 0.2 mm. The sheet was placed on one surface of a hard aluminum foil having a thickness of 100 μm and a surface roughness of 8 μm and bonded to the hard aluminum foil with a heat roll at a temperature of 90° C., to obtain a lubricant sheet for making a hole.

The lubricant sheet for making a hole was measured for sheet adhesion strength and warpage and evaluated for holes in the same manner as in Example 10. Table 4 shows the results.

EXAMPLE 12

20 parts by weight of a polyethylene glycol.dimethyl terephthalate polycondensate (trade name: PAOGEN PP-15), 10 parts by weight of polyethylene oxide having a number average molecular weight of 40,000 (trade name: ALKOX R-150) and 70 parts by weight of polyoxyethylene propylene block polymer (trade name: Pronon 208) were used. The same procedures as those in Example 10 was carried out, to obtain a lubricant sheet for making a hole. The lubricant sheet had no stickiness and the lubricant sheet was easy to handle.

The lubricant sheet was measured for sheet adhesion strength and warpage and evaluated for holes in the same manner as in Example 10. Table 4 shows the results.

Comparative Example 4

The sheet obtained in Example 10 was placed on one surface of a hard aluminum foil having a thickness of 100 μm and a surface roughness of 2 μm and bonded to the hard aluminum foil with a heat roll at a temperature of 90° C., to obtain a lubricant sheet for making a hole.

The lubricant sheet for making a hole was measured for sheet adhesion strength and warpage and evaluated for holes in the same manner as in Example 10. Table 4 shows the results.

Comparative Example 5

The sheet obtained in Example 10 was placed on one surface of a hard aluminum foil having a thickness of 100 μm and a surface roughness of 2 μm and bonded to the hard aluminum foil with a heat roll at a temperature of 110° C., to obtain a lubricant sheet for making a hole.

The lubricant sheet for making a hole was measured for sheet adhesion strength and warpage and evaluated for holes in the same manner as in Example 10. Table 4 shows the results.

Comparative Example 6

Holes were made under the same conditions for making a hole with a drill as those in Example 10 except that the lubricant sheet for making a hole obtained in Example 10 was replaced with a hard aluminum foil having a thickness of 150 μm and a surface roughness of 2 μm. The holes were evaluated. Table 4 shows the results.

TABLE 4

|  | Sheet adhesion strength (g/cm) | Warpage (mm) | Evaluation Results of hole (after 4,000 hits) | | |
|---|---|---|---|---|---|
|  |  |  | Haloing (μm) | Smear | Location accuracy of hole (μm) |
| Example 10 | 350 | 19 | 150 | 9.5 (9.0) | 30 |
| Example 11 | 300 | 20 | 130 | 9.6 (9.1) | 40 |
| Example 12 | 350 | 18 | 140 | 9.4 (8.9) | 30 |
| Comparative Example 4 | 100 | 23 | 190 | 8.9 (7.5) | 50 |
| Comparative Example 5 | 300 | 40 | 150 | 9.4 (8.9) | 40 |
| Comparative Example 6 |  |  | 500 | 8.5 (4.0) | 70 |

Test Methods

Adhesion strength: A sheet portion having a width of 10 mm was peeled off and a value measured with a tensile strength tester was shown (based on the measuring method for copper foil peeling strength according to JIS C6481).

Warpage: A lubricant sheet was hung at right angles from the center of one side of the lubricant sheet, a straightedge was disposed on the one side of the lubricant sheet in parallel, and a maximum gap between the straightedge and a lubricant sheet surface was measured with a metal linear scale to obtain a value for expressing warpage.

EXAMPLE 13

50 parts by weight of a polyethylene glycol.dimethyl terephthalate polycondensate (trade name: PAOGEN PP-15) and 50 parts by weight of polyoxyethylene monostearate (trade name: Nonion S-40) were kneaded with a kneader in a nitrogen atmosphere at a temperature of 150° C., and the kneaded mixture was extruded with an extruder to form a water-soluble polymer sheet having a thickness of 0.1 mm. The water-soluble polymer sheet was placed on one surface of an aluminum foil (material: 1070, aluminum purity: 99.7%) having a thickness of 100 μm and bonded to the aluminum foil with a heat roll to form a lubricant sheet for making a hole.

Three glass epoxy boards having a thickness of 0.1 mm each were stacked. The lubricant sheet for making a hole was disposed on the top surface of the stacked boards. A backup board (paper phenol laminate) was disposed on the lower surface of the stacked boards. Then, holes were made with a drill under conditions of a drill bit: 0.1 mm φ, the number of revolutions: 150,000 rpm, and a feeding rate: 2.5 μ/rev. The holes were evaluated. Table 5 shows the results.

EXAMPLE 14

70 parts by weight of a polyethylene glycol.dimethyl terephthalate polycondensate (trade name: PAOGEN PP-15) and 30 parts by weight of polyethylene glycol having a number average molecular weight 8,000 were used. The same procedures as those in Example 13 were carried out to obtain a water-soluble polymer sheet having a thickness of 0.1 mm. The water-soluble polymer sheet was placed on one surface of an aluminum foil (material: 1085, aluminum purity: 99.85%) having a thickness of 100 μm and bonded to the aluminum foil with a heat roll to form a lubricant sheet for making a hole. The lubricant sheet was evaluated for holes in the same manner as in Example 13. Table 5 shows the results.

EXAMPLE 15

20 parts by weight of a polyethylene glycol.dimethyl terephthalate polycondensate (trade name: PAOGEN PP-15), 10 parts by weight of polyethylene oxide having a number average molecular weight of 40,000 (trade name: ALKOX R-150) and 70 parts by weight of polyoxyethylene propylene block polymer (trade name: Pronon 208) were used. The same procedures as those in Example 13 was carried out, to obtain a lubricant sheet for making a hole. The lubricant sheet was evaluated for holes in the same manner as in Example 13. Table 5 shows the results.

Comparative Example 7

The water-soluble polymer sheet obtained in Example 13 was placed on one surface of an aluminum foil (material: IN30, aluminum purity: 99.3%) having a thickness of 100 μm and bonded to the aluminum foil with a heat roll to form a lubricant sheet for making a hole. The lubricant sheet was evaluated for holes in the same manner as in Example 13. Table 5 shows the results.

Comparative Example 8

Attempts were made to make holes under the same conditions for making a hole with a drill as those in Example 13 except that the lubricant sheet for making a hole was replaced with an aluminum foil (material: IN30) having a thickness of 150 μm. During the processing, the drill bit was broken. Attempts to make holes were carried out again. The drill bit was similarly broken.

TABLE 5

| | Roughness of hole wall (μm) | | Location accuracy of hole (μm) | |
| --- | --- | --- | --- | --- |
| | Average value | Maximum value | Average value | Maximum value |
| Example 13 | 2 | 5 | 9 | 21 |
| Example 14 | 2 | 5 | 6 | 16 |
| Example 15 | 2 | 4 | 8 | 19 |
| Comparative Example 7 | 3 | 8 | 11 | 47 |
| Comparative Example 8 | — | — | — | — |

(Test Methods)

Roughness of hole wall: A sample was treated by plating, a cross section was observed through a microscope, the roughness of a hole wall was measured to obtain an average value and a maximum value (after 2,000 hits, 20 holes).

Location accuracy of hole: Three sample boards were stacked. 2,000 hits were performed. Concerning 500 holes therefrom, misregistration between a reference value of a hole location and the location of a hole in the lower board of the stacked boards after the hole was made was measured with a coordinate measuring machine to obtain an average value and a maximum value.

What is claimed is:

1. A lubricant sheet for making a hole used for a printed circuit board, comprising an organic substance layer having a thickness of 0.02 to 3.0 mm and formed of a mixture (a) or a mixture (b) and a metal foil having a thickness of 0.05 to 0.5 mm, said organic substance layer being formed on one surface of said metal foil, said mixture (a) being a mixture containing 20 to 90 parts by weight of polyether ester (I), 10 to 80 parts by weight of a solid water-soluble lubricant (II), the total amount of the polyether ester (I) and the solid water-soluble lubricant (II) being 100 parts by weight, and 2 to 10 parts by weight of polyethylene glycol (III) having a number average molecular weight of 200 to 600, and said mixture (b) being a mixture containing 20 to 90 parts by weight of said polyether ester (I), 10 to 80 parts by weight of said solid water-soluble lubricant (II), the total amount of the polyether ester (I) and the solid water-soluble lubricant (II) being 100 parts by weight, and 2 to 20 parts by weight of a liquid water-soluble lubricant (IV).

2. A lubricant sheet according to claim 1, wherein said polyether ester (I) contains a polyethylene oxide having a number average molecular weight of at least 10,000.

3. A lubricant sheet according to claim 2, wherein said polyethylene oxide having a number average molecular weight of at least 10,000 is contained in an amount ratio of from 10 to 200 parts by weight based on 100 parts by weight of said polyether ester (I).

4. A lubricant sheet according to claim 1, wherein said polyether ester (I) has a melting point or a softening point in the range of from 30 to 200° C.

5. A lubricant sheet according to claim 1, wherein said solid water-soluble lubricant (II) is at least one lubricant selected from the group consisting of polyethylene glycol having a number average molecular weight of from 1,000 to 9,000, a monoether of polyoxyethylene, an ester of polyoxyethylene, polyoxyethelene sorbitan monostearate, polyglycerine monostearate and a polyoxyethylene propylene block polymer.

6. A lubricant sheet according to claim 1, wherein said solid water-soluble lubricant (II) has a melting point or a softening point in the range of from 30 to 200° C.

7. A lubricant sheet according to claim 1, wherein said liquid water-soluble lubricant (IV) is at least one lubricant selected from the group consisting of a liquid monoether of polyoxyethylene, an ester of polyoxyethylene, a sorbitan monoester of polyoxyethelene, liquid polyglycerine monoesters and a liquid polyoxyethylene propylene block polymer.

8. A lubricant sheet according to claim 1, wherein said liquid water-soluble lubricant (IV) is liquid at room temperature.

9. A method of making a hole in a printed circuit board, comprising disposing the lubricant sheet for making a hole recited in claim 1 on at least a topmost surface of a printed circuit board and making a hole with a drill in said printed circuit board from the topmost surface side.

10. A lubricant sheet for making a hole used for a printed circuit board, comprising a layer formed of a water-soluble polymer and having a thickness of 0.02 to 3.0 mm and a metal foil having a thickness of 0.05 to 0.5 mm, said water-soluble polymer layer being formed on one surface of said metal foil, and the lubricant sheet having at least one constitution selected from (a), (b) and (c),
(a) said water-soluble polymer layer is formed of a mixture of the water-soluble polymer and an organic filler (V),
(b) the surface of said metal foil which surface is to be bonded to said water-soluble polymer layer has a surface roughness of from 5 to 15 $\mu$m, and
(c) said metal foil is an aluminum foil having an aluminum purity of at least 99.5%.

11. A lubricant sheet according to claim 10, wherein said water-soluble polymer layer is an organic substance layer composed of 20 to 90 parts by weight of said polyether ester (I) and 10 to 80 parts by weight of said solid water-soluble lubricant (II).

12. A lubricant sheet according to claim 10, wherein said water-soluble polymer layer has a thickness of from 0.02 to 1.0 mm.

13. A lubricant sheet according to claim 11, wherein said organic filler (V) is added in an amount of 1 to 50 parts by weight when the total amount of said polyether ester (I) and said solid water-soluble lubricant (II) is 100 parts by weight.

14. A method of making a hole in a printed circuit board, comprising disposing the lubricant sheet for making a hole recited in claim 10 on at least a topmost surface of a printed circuit board and making a hole with a drill in said printed circuit board from the topmost surface side.

* * * * *